United States Patent
Nair et al.

(10) Patent No.: US 9,438,138 B2
(45) Date of Patent: Sep. 6, 2016

(54) MAGNETOSTRICTIVE DEVICES AND SYSTEMS

(71) Applicant: Oscilla Power Inc., Salt Lake City, UT (US)

(72) Inventors: Balakrishnan Nair, Sandy, UT (US); Jesse Alan Nachlas, Salt Lake City, UT (US); Zachary Murphree, Dallas, TX (US)

(73) Assignee: Oscilla Power Inc., Seattle, WA (US)

(\*) Notice: Subject to any disclaimer, the term of this patent is extended or adjusted under 35 U.S.C. 154(b) by 118 days.

(21) Appl. No.: 14/181,574

(22) Filed: Feb. 14, 2014

(65) Prior Publication Data

US 2014/0225371 A1    Aug. 14, 2014

Related U.S. Application Data

(60) Provisional application No. 61/764,732, filed on Feb. 14, 2013, provisional application No. 61/809,155, filed on Apr. 5, 2013.

(51) Int. Cl.
| | | |
|---|---|---|
| H02N 2/18 | (2006.01) | |
| F03B 13/18 | (2006.01) | |
| H01L 41/12 | (2006.01) | |

(52) U.S. Cl.
CPC .......... *H02N 2/18* (2013.01); *F03B 13/18* (2013.01); *F03B 13/188* (2013.01); *F03B 13/189* (2013.01); *F03B 13/1885* (2013.01); *H01L 41/125* (2013.01); *Y02E 10/38* (2013.01)

(58) Field of Classification Search
CPC .............................. Y02E 10/38; Y02E 10/32
USPC ...................................................... 290/42, 53
See application file for complete search history.

(56) References Cited

U.S. PATENT DOCUMENTS

| | | | | |
|---|---|---|---|---|
| 3,487,228 | A * | 12/1969 | Kriegel | 290/52 |
| 6,392,314 | B1 * | 5/2002 | Dick | 290/53 |
| 8,308,449 | B2 * | 11/2012 | Smith | 417/331 |
| 8,628,303 | B2 * | 1/2014 | Smith | 417/53 |
| 2007/0126239 | A1 * | 6/2007 | Stewart et al. | 290/53 |
| 2009/0165454 | A1 * | 7/2009 | Weinberg | 60/497 |
| 2010/0133843 | A1 * | 6/2010 | Nair | 290/53 |
| 2010/0180588 | A1 * | 7/2010 | Yu | 60/497 |
| 2011/0036085 | A1 * | 2/2011 | Oigarden | 60/505 |
| 2011/0089697 | A1 * | 4/2011 | Nair | 290/53 |
| 2011/0133463 | A1 * | 6/2011 | Nair et al. | 290/53 |
| 2012/0001427 | A1 * | 1/2012 | Guruswamy et al. | 290/42 |
| 2012/0086205 | A1 | 4/2012 | Nair et al. | |
| 2013/0033130 | A1 | 2/2013 | Nair et al. | |
| 2013/0069368 | A1 * | 3/2013 | Park | F03B 13/16 290/53 |
| 2013/0341927 | A1 * | 12/2013 | Murphree | 290/53 |

OTHER PUBLICATIONS

Halbach "Design of Permanent Multipole Magnets with Oriented Rare Earth Cobalt Materials" Nuclear Instruments and Methods 169, (1980), 12 pages.

Nakamura "International Preliminary Report on Patentability" for PCT Application No. PCT/US14/16614, mailed Aug. 27, 2015, 6 pages.

\* cited by examiner

*Primary Examiner* — Tulsidas C Patel
*Assistant Examiner* — Sean Gugger
(74) *Attorney, Agent, or Firm* — Jeffrey T. Holman

(57) ABSTRACT

The device generates electrical energy from mechanical motion. The device includes at least one magnetostrictive element and at least one force modifier. The force modifier is coupled to the magnetostrictive element. The force modifier receives an input force and applies a modified force to the magnetostrictive element.

13 Claims, 7 Drawing Sheets

MAGNETOSTRICTIVE DEVICES AND SYSTEMS

CROSS-REFERENCE TO RELATED APPLICATIONS

This application claims the benefit of U.S. Provisional Application No. 61/764,732, filed on Feb. 14, 2013, and U.S. Provisional Application No. 61/809,155, filed on Apr. 5, 2013. Each of these applications is incorporated by reference herein in its entirety.

STATEMENT OF FEDERALLY SPONSORED RESEARCH

This invention was made with Government support under Grant No. IIP-1127503 awarded by the National Science Foundation. The Government has certain rights to this invention.

BACKGROUND

Many different systems exist for power generation. With advances in technology comes the need to provide power to operate that technology. Frequently, power generation must be portable or able to collect energy from diverse environments without doing damage to that environment. Many conventional systems are restricted in where and how they may be deployed and also rely on wasteful, harmful, or unsustainable processes.

SUMMARY

Embodiments of a device are described. In one embodiment, the device is a device for generating electrical energy from mechanical motion. An embodiment of the device includes at least one magnetostrictive element and at least one force modifier. The force modifier is coupled to the magnetostrictive element. The force modifier receives an input force and applies a modified force to the magnetostrictive element. Other embodiments of the device are also described.

Embodiments of a method are also described. In one embodiment, the method is a method for generating electrical energy from mechanical motion. In one embodiment, the method includes receiving an input force from a mechanical motion. The method also includes modifying the input force. The method also includes applying a modified output to a magnetostrictive element. Other embodiments of the method are also described.

Embodiments of an apparatus are also described. In one embodiment, the apparatus is a buoy apparatus for generating electrical energy from motion of ocean waves. The apparatus includes a buoy housing, a magnetostrictive element, a tether coupling point, a force modifier, and a coil. The magnetostrictive element is disposed within an interior of the buoy housing. The force modifier is disposed at least partially within the interior of the buoy housing. The force modifier is coupled to the tether coupling point. The force modifier receives an input force from the tether coupling point. The force modifier applies a modified output force to the magnetostrictive element. The coil is disposed within a magnetic field of the magnetostrictive element.

Other aspects and advantages of embodiments of the present invention will become apparent from the following detailed description, taken in conjunction with the accompanying drawings, illustrated by way of example of the principles of the invention.

DETAILED DESCRIPTION

Figure 1:
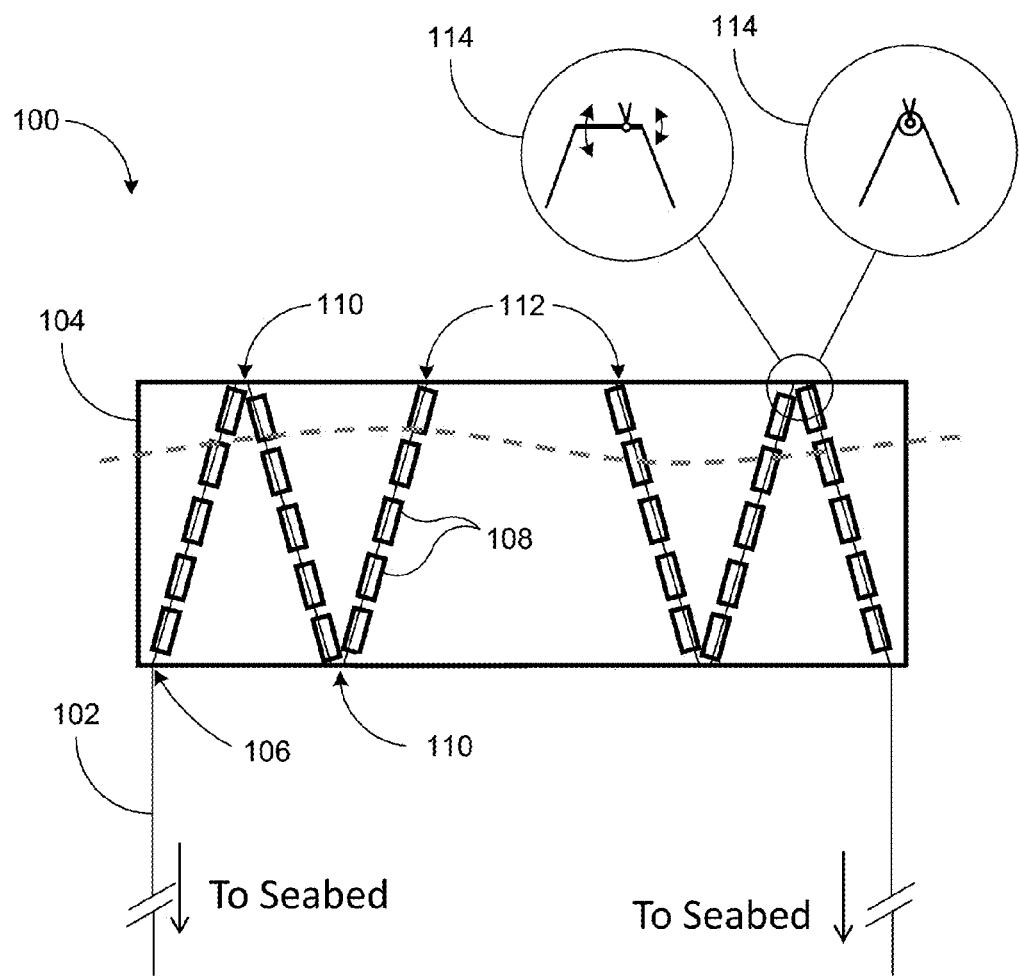
FIG. 1 depicts one embodiment of a buoy-housed system with a continuation of the tether inside the buoy.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Although many embodiments are described herein, at least some embodiments use mechanical force to cause stress in a magnetostrictive element, which results in changes in the magnetic properties and, thereby, induces a voltage in a coil surrounding the element. Embodiments described herein are different from conventional devices.

The power density of magnetostrictive power generation systems can be enhanced by the incorporation of systems that impart mechanical advantage. This may take the form of mechanical load amplification or applied frequency amplification or both.

In some embodiments, a magnetostrictive energy harvester may be coupled with one or more mechanical (e.g. levers, pulleys, block and tackle systems) or hydraulic components/systems that can impart an enhancement in the mechanical load applied to the system.

In a hydraulic load enhancement system, an applied force imparted onto the energy generation device/system from the environment may cause a piston to compress a fluid (e.g. hydraulic oil). The energy stored in the pressurized fluid can then be used to apply stress to the magnetostrictive elements housed in the buoy. The use of hydraulics can create advantages in the harvesting of energy from this system. The force on the tethers causes a piston to compress a fluid such as hydraulic oil. The energy stored in the pressurized fluid can then be used to apply stress to the magnetostrictive elements. In some embodiments, the hydraulic energy would be to move a piston of a different bore size to obtain a force amplification/reduction which could be applied to the magnetostrictive elements. This could be advantageous for power production, as a greater force multiplication will enhance the effective power density of the system. In some embodiments, such a system could be used to implement a way to prevent extreme loads caused by large waves to be applied to the system. This could be done by using a valve to release the pressure over a certain value. In some embodiments, a double acting hydraulic cylinder such that the system is compressing the fluid on a tensile and compressive applied load. Another proposed use of the hydraulics would be a double acting hydraulic cylinder such that the system is compressing the fluid on both sides of the wave.

In one embodiment it is possible to achieve higher energy density for an energy generating device by increasing the frequency at which a stress is applied and released to the energy generating device. This can be accomplished by using a hydraulic system that is properly configured as part of the load transfer mechanism. In this case the energy or force that is the natural source from which electrical energy is being generated is first transferred to a hydraulic component, typically a hydraulic cylinder. The hydraulic cylinder absorbs the energy from the system and stores it in a hydraulic accumulator. The stored energy from the accumulator is then transferred to the energy generator and is released in short pulses through the use of a series of valves and a timing mechanism. By converting a single large impulse of energy into many discreet pulses of energy that are being applied to the energy generator, in effect, a frequency amplification of the applied load to the magnetostrictive material is accomplished.

Many conventional devices and systems to make electric power from ocean waves have a design that included magnetostrictive power takeoff (PTO) units disposed along at least one tether between a buoy and an anchor. However, there are a number of difficulties associated with housing magnetostrictive power take-off units inside individual waterproof, pressure-tight enclosures disposed along the taut tether connecting the buoy to the mooring. These difficulties include transferring substantial loads through several water-tight connection points, electrically connecting the PTOs, deployment, maintenance, corrosion protection of individual units, etc.

This invention relates to a buoy/mooring system with magnetostrictive energy harvesters disposed inside the buoy or a single bottom-founded enclosure. These two embodiments have a number of advantages over individual PTOs deployed along the tether, but there are also specific challenges associated with each new embodiment. Some of the advantages are:

1. Ease of maintenance
2. Less complicated corrosion protection
3. Use of fewer underwater electrical connections
4. No pressure vessel requirements (for buoy-housed system)
5. Ease of monitoring for failure (i.e. FMEA controls)
6. No loss of PTO in case of tether failure
7. Ease of deployment
8. Possible ability to amplify force (pulley/block-and-tackle system)
9. Single flexible portion to accommodate motion (large diaphragm)
10. More easily recoverable in case of catastrophic failure, with the exception of sinking FIG. 1 depicts one embodiment of a buoy-housed system 100 with a continuation of the tether 102 inside the buoy 104. The illustrated embodiment includes the tether 102, the buoy 104, a tether entry point 106, magnetostrictive elements 108, free connection points 110, and secured connection points 112. In the illustrated embodiment, the tether 102 passes into the internal region of the buoy 104 through the sealed entry point 106. In some embodiments, the sealed entry point 106 includes a seal to allow the tether 102 to move without allowing water to enter the buoy 104. In the illustrated embodiment, the individual magnetostrictive generators or elements 108 are disposed along an internal continuation of the tether 102 inside the buoy 104. In one embodiment, the buoy 104 contains the same amount of magnetostrictive components 108 as would normally be deployed along the length of the tether 102 with the elements 108 deployed along the length of the tether 102 outside of the buoy 104. This also affords the opportunity of increasing the load through use of levers, pulleys, block-and-tackle, hydraulic systems or other force multiplication systems (illustrated by examples 114) that may be attached at connection points 110 and 112. These systems trade distance for force, so their use would allow the buoy 104 to move more than it would were they not used. This may reduce the strain on the tether 102 and the system 100 as a whole. In some embodiments, the free connection points 110 allow the portion of the tether 110 internal to the buoy 104 to roll through and apply strain to each of the elements 108. In some embodiments, the free connection points 110 may allow for force modification through use of hydraulic, electric, magnetic, or mechanical force modifiers as described above. In the illustrated embodiment, the tether 102 attaches the buoy 104 to the seabed. In another embodiment, the tether 102 attaches the buoy 104 to a heave plate (not shown)

or a fixed sub-surface structure to allow the buoy 104 to move with the ocean waves and create stress in the elements 108.

Figure 2:
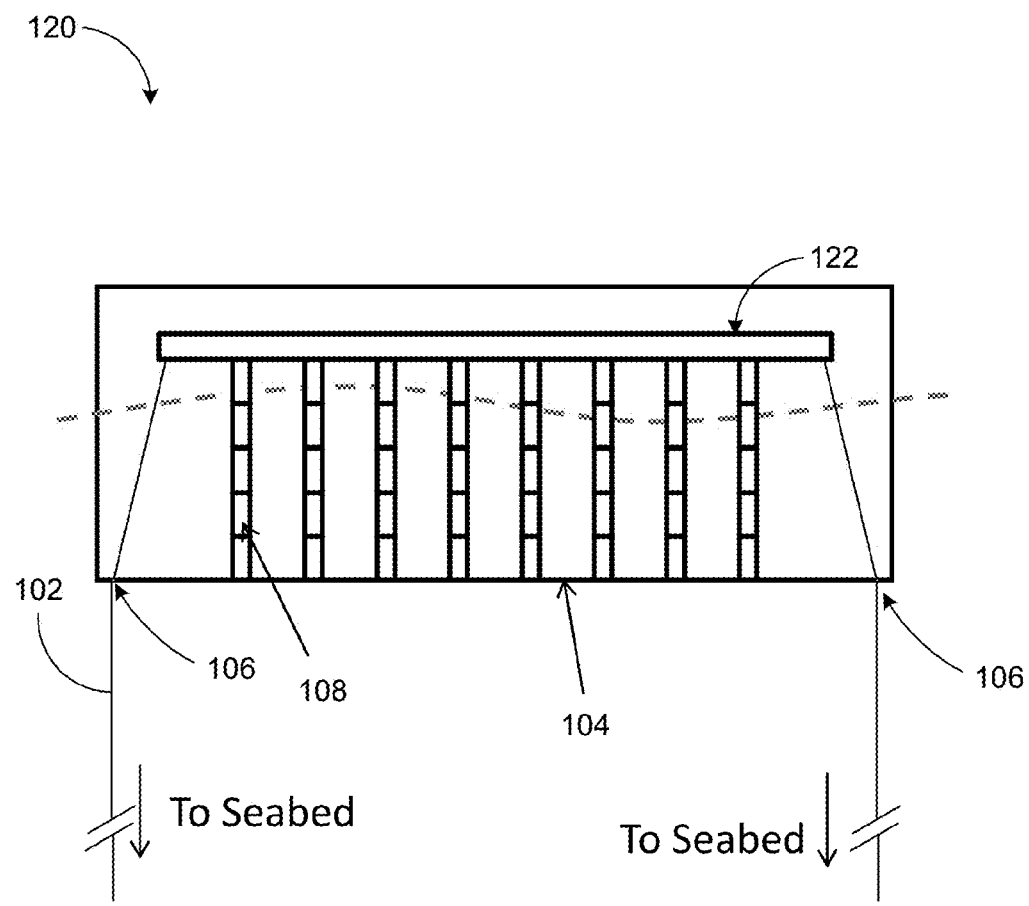
FIG. 2 depicts one embodiment of a buoy-housed system with an upper load plate.
Figure 3A:
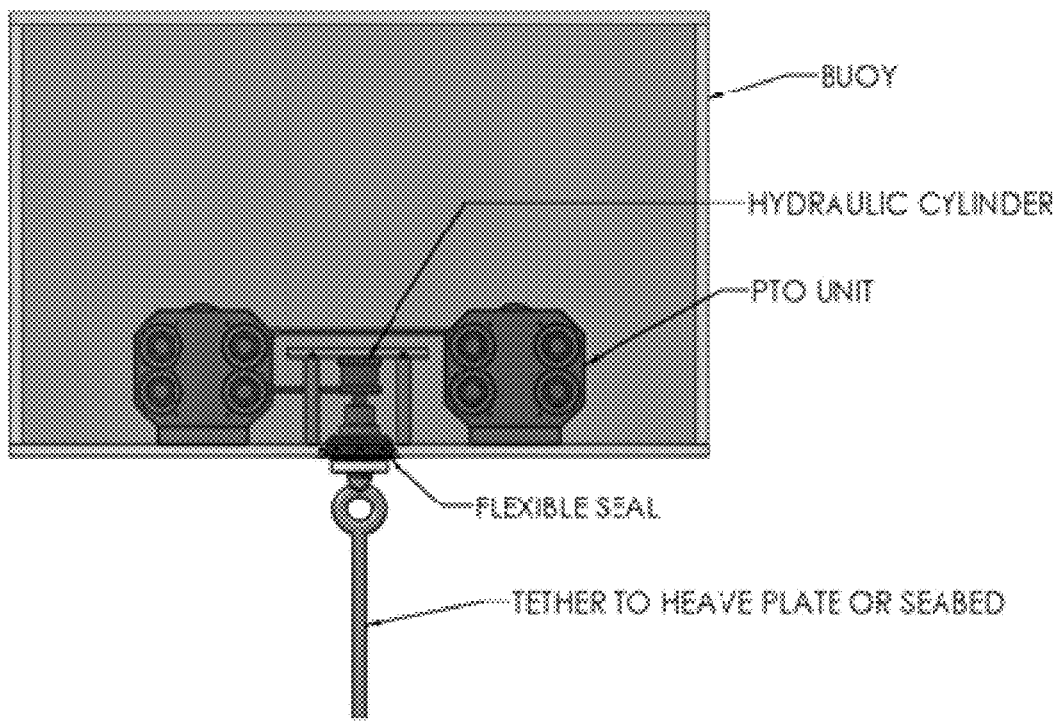
FIG. 3(a) depicts a schematic diagram of one embodiment of a buoy apparatus for power generation.
Figure 3B:
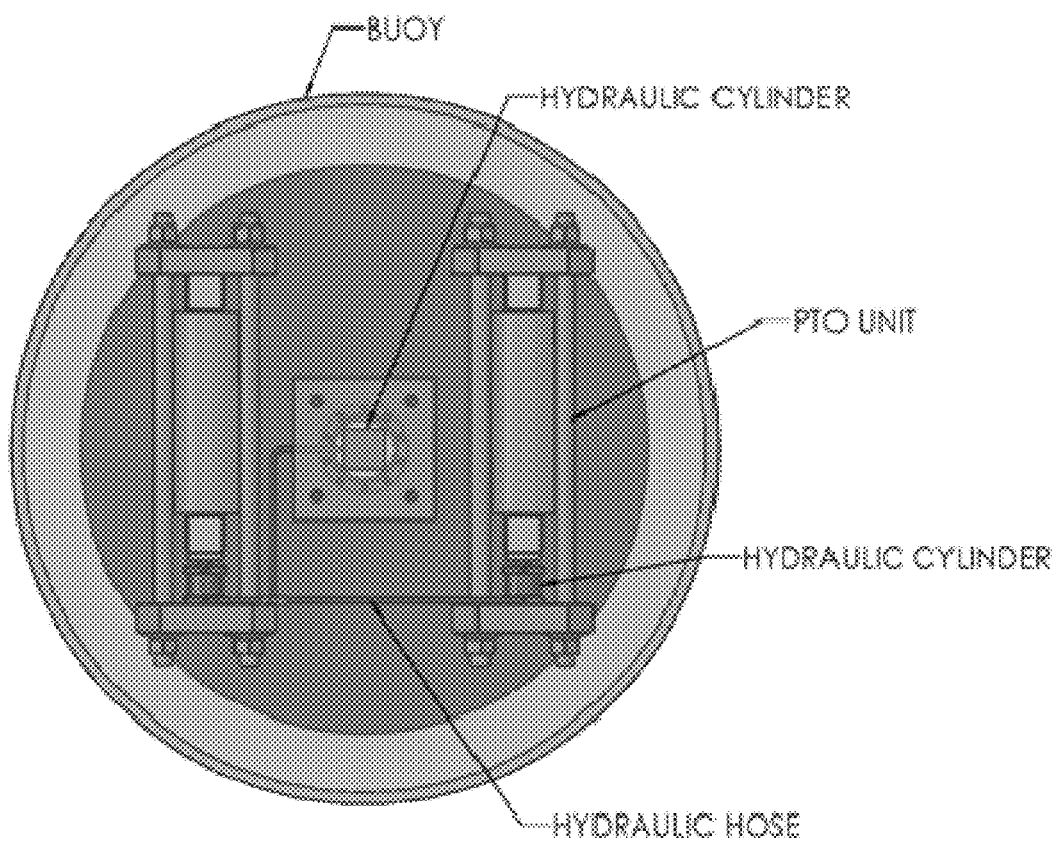
FIG. 3(b) depicts a schematic diagram of another embodiment of a buoy apparatus for power generation.

FIG. 2 depicts one embodiment of a buoy-housed system 120 with an upper load plate 122. In the illustrated embodiment, the load to the magnetostrictive generators or elements 108 is compressive. In one embodiment, the buoy 104 houses one or more individual magnetostrictive generators or elements 108 that are mechanically in series or parallel (i.e. sharing an applied load, or carrying the same applied load), deployed between an upper load plate 122 which is connected to the tethers 102, and an internal surface of the buoy 104. This system would greatly reduce or eliminate the need for precompression of the magnetostrictive rods 108 because the hydrodynamic forces would result in compression rather than tension. This may provide substantial cost savings by eliminating the need for components used for pre-compression. In one embodiment, the tether 102 may be run through a pulley or other device at the top of inside of the buoy 104 with the load plate 122 hung towards the bottom of the buoy 104 and the elements 108 hung from the upper interior surface of the buoy 104. This would allow the weight of the load plate 122 to apply tension to the elements 108 when the tether 102 is relaxed and compression when the tether 102 is pulled taught by the movement of the ocean waves. Other embodiments may include fewer or more arrangements and components to incorporate less or more functionality.

The illustrated system also benefits from the location of the magnetostrictive generators as included inside the buoy and separated from the water. Each unit does not require a separate casing and indeed may have completely different architecture and geometry relative to the architecture and geometry of PTOs disposed on the tethers. Indeed, the load can be transferred to one or more magnetostrictive alloy components 108 (rods, bars etc) with none of the external casing, pre-compression and other components associated with other systems which incorporate magnetostrictive PTOs. In another embodiment, a single, bottom-founded housing (not shown) would have many of the same benefits. The configuration could be similar to any buoy-housed configuration, as the bottom-founded concept is essentially an upside-down version of the buoy housing disposed at the bottom of the tethers. This configuration could be advantageous in that the direction of loading could be reversed through a pulley, gear of alternative system, which, in combination with the bottom founding, could simplify the structural requirements of the enclosure. The bottom-founded system would also avoid an increase in buoy size that might be necessary in the buoy-housed configuration in order to meet the buoyancy requirements related to survivability. This configuration would also eliminate the need for the electrical umbilicals that would run from the buoy to the ocean floor in either the buoy-housed or individual PTO enclosure configuration, which could increase the reliability of the system.

In a recent patent application we disclosed the use of a heave plate as an advantageous design for a mooring system (see Provisional Application No. 61/664,444, filed Jun. 26, 2012, entitled "Magnetostrictive Wave Energy Harvester with Heave Plate"). With that disclosure incorporated by reference herein it is also possible that a bottom-founded design could mount the PTO units within a structure that serves as the heave plate. One advantage to this configuration is that the sealed container that houses the PTO units would have a lower sealing pressure requirement because in general a heave plate is deployed a short distance below the water surface as opposed to being located on the sea floor.

Additionally, the use of hydraulics can create advantages in the harvesting of energy from this system. In one embodiment, the force on the tethers 102 causes a piston (described in greater detail with reference to FIGS. 4(*a*) and 4(*b*)) to compress a fluid such as hydraulic oil. The energy stored in the pressurized fluid can then be used to apply stress to the magnetostrictive elements housed in the buoy. Through the use of valves, the energy can be released at a controlled frequency over a controlled amount of time. This could be advantageous for power production. Another use of the hydraulic energy would be to move a piston of a different bore size to obtain a force amplification/reduction which could be applied to the magnetostrictive elements. Another benefit to the use of the hydraulic energy would be to prevent extreme loads caused by large waves to be applied to the system through controlled release systems. This could be done by using a valve to release the pressure over a certain value (describe in more detail below with reference to FIG. 4(*a*)). Another embodiment includes a double acting hydraulic cylinder to compress hydraulic fluid on both sides of the wave. Other embodiments may incorporate other components to achieve more or less functionality. Some example of alternative embodiments are illustrated in FIGS. 2(*b*) and 2(*c*).

Figure 4A:
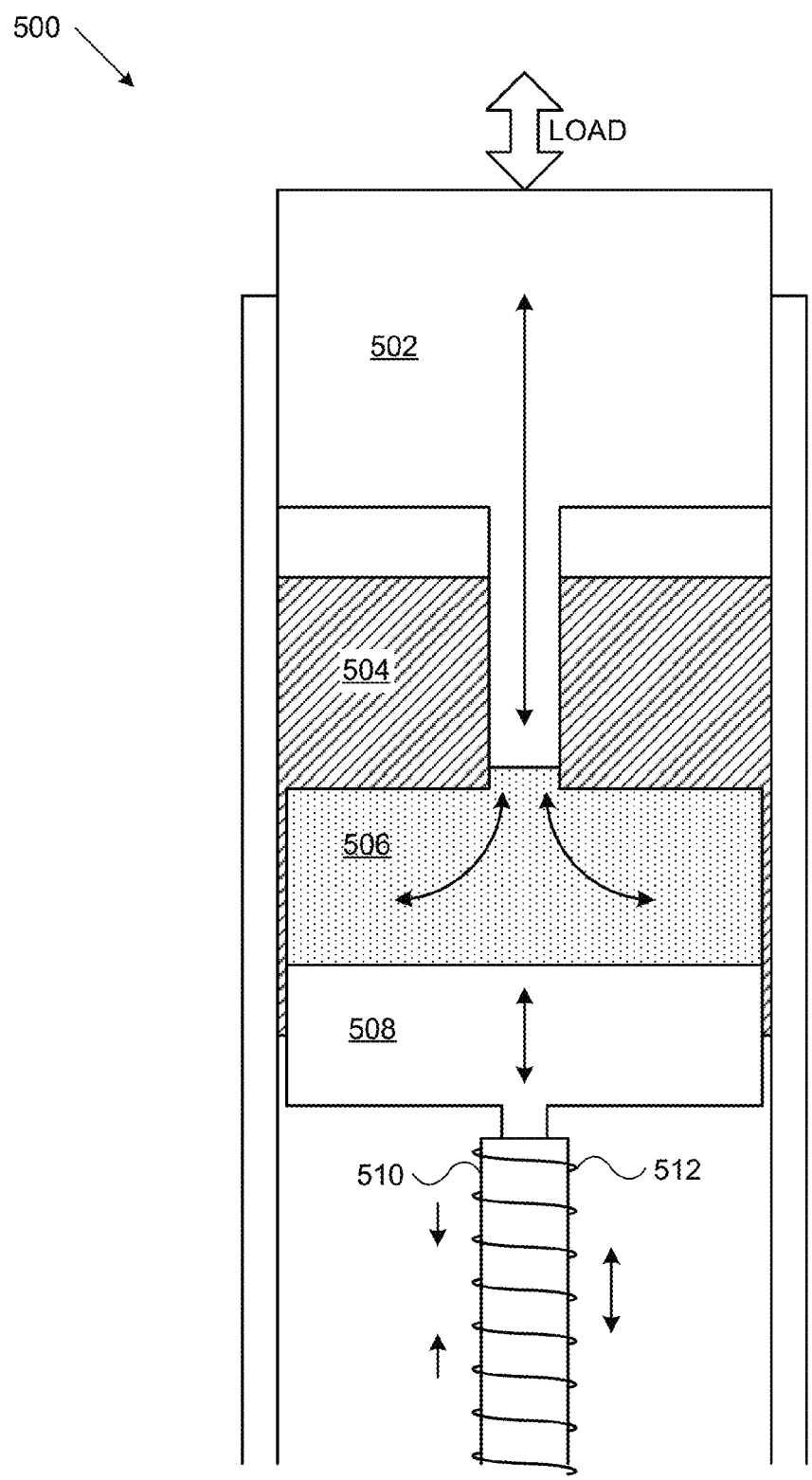
FIG. 4(a) depicts a schematic diagram of one embodiment of a hydraulic force modifier.
Figure 4B:
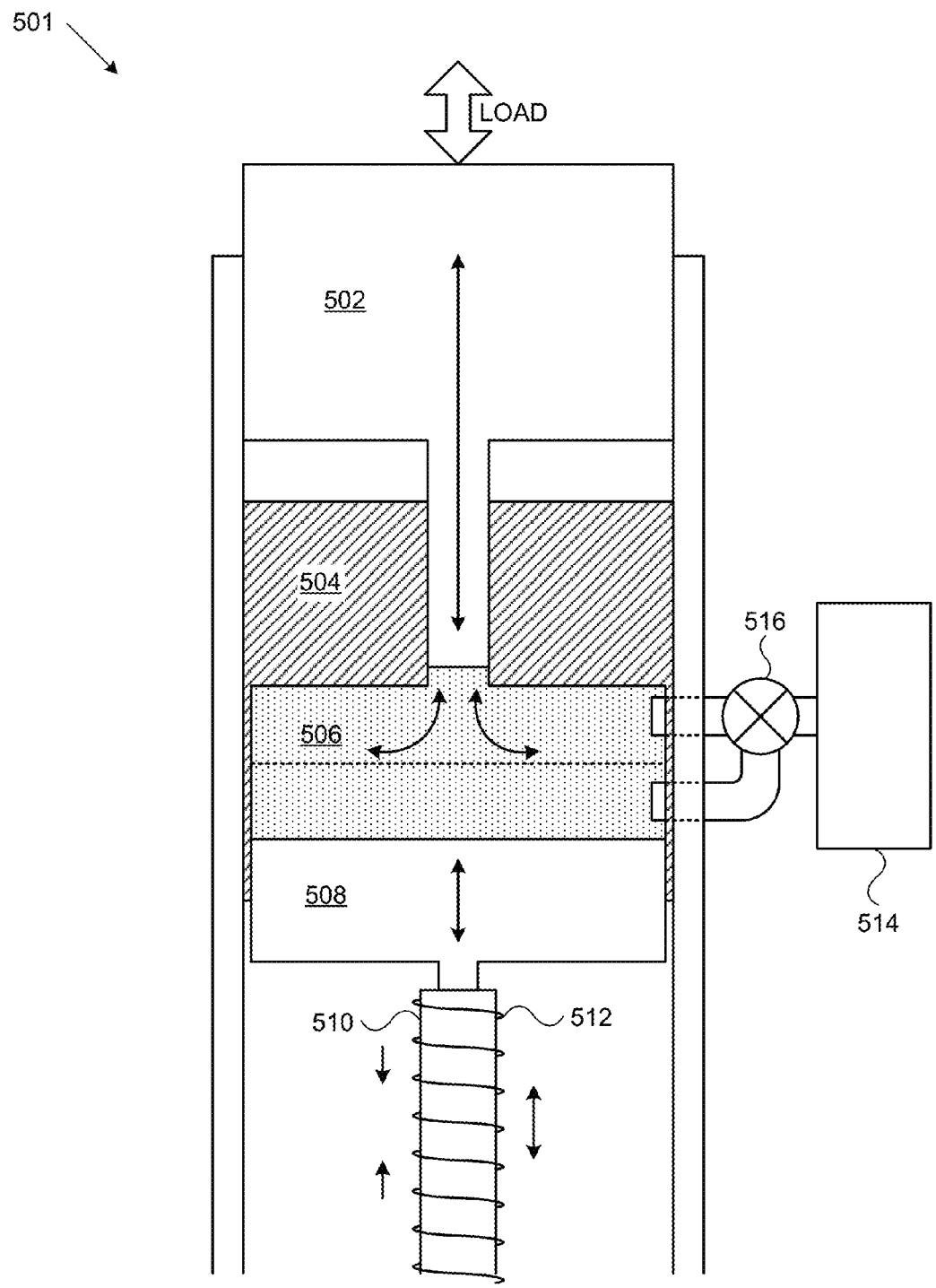
FIG. 4(b) depicts another embodiment of the hydraulic force modifier of FIG. 4(a).

FIG. 4(*a*) depicts a schematic diagram of one embodiment of a hydraulic force modifier system 500. The illustrated embodiment includes a small area hydraulic piston 502, a hydraulic reservoir 504, hydraulic fluid 506, a large area hydraulic piston 508, a magnetostrictive rod element 510, and a coil 512. In one embodiment, the small area hydraulic piston 502 has a hydraulic surface with a small area. In one embodiment, the small area hydraulic piston 502 receives an input load from an external source of mechanical movement. The small piston 502 moves into and out of the hydraulic reservoir to apply force to the hydraulic fluid 506. As the small piston 502 applies force to the hydraulic fluid 506, the large area hydraulic piston 508 is acted upon by the hydraulic fluid in an effort to reach equilibrium. If the small piston 502 moves into the hydraulic reservoir 504, the hydraulic fluid 506 would be pressurized and apply a force to the large piston 508. The large piston 508 would them move out of the hydraulic reservoir 504 and apply a force to the magnetostrictive element 510. The force on the magnetostrictive element 510 would cause mechanical strain in the element 510. The resulting strain would cause a change in the magnetic field of the element 510. The change in the magnetic field of the element 510 would generate electrical power in the coil 512 surrounding the element 510 through induction. The illustrated system 500 allows a relatively larger travel distance of the small piston 502 to result in a relatively smaller travel distance of the large piston 508. In some embodiments, the modification of the force placed on the small piston 502 by the load applies a more suitable force on the magnetostrictive element 510. This allows for more efficient power generation and increased durability of the system 500 over conventional systems.

Figures 5, 6:
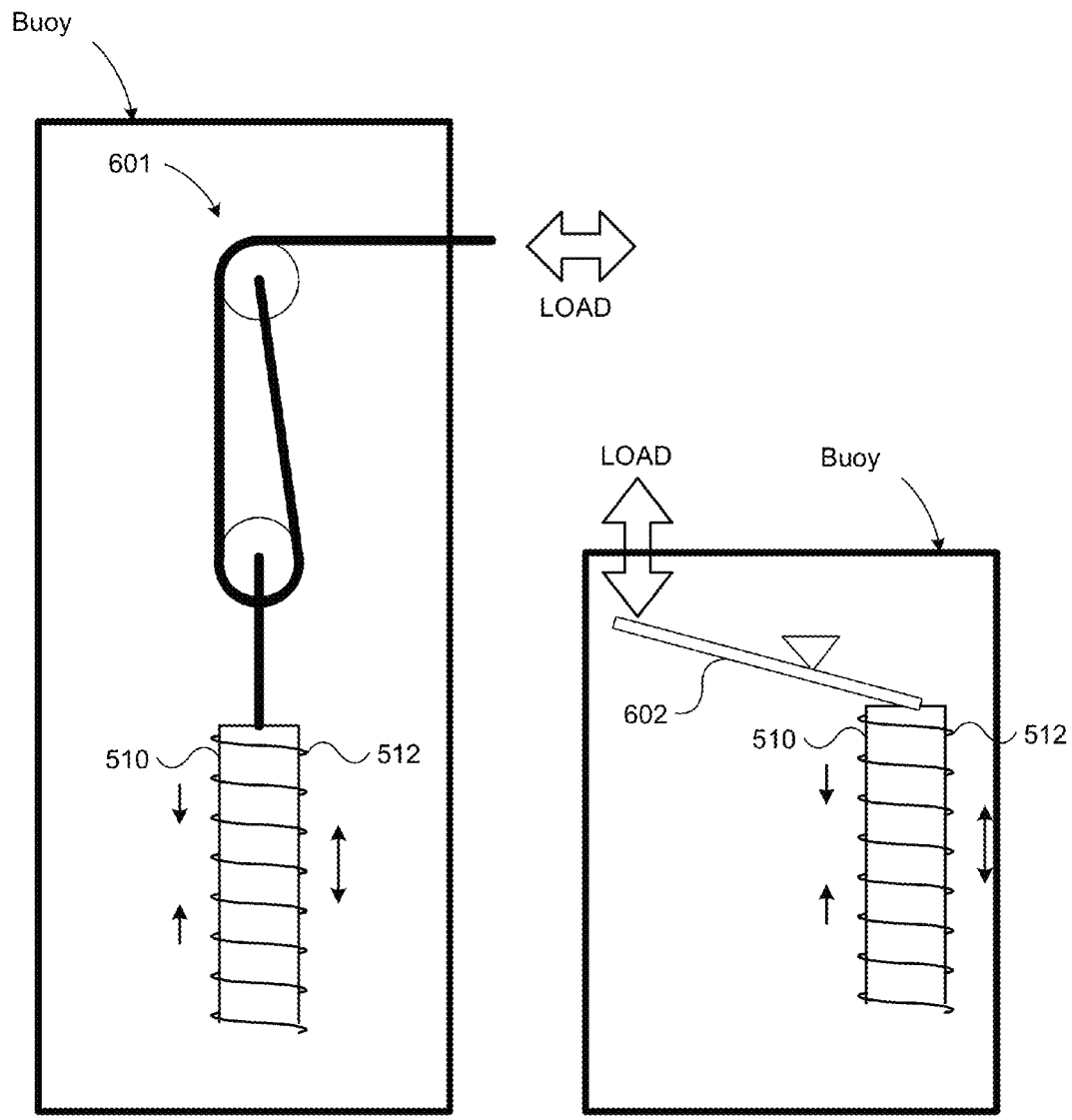
FIG. 5 depicts a schematic diagram of one embodiment of a hydraulic force modifier partially within an interior of a buoy.
FIG. 6 depicts a schematic diagram of one embodiment of a lever partially within an interior of a buoy.

In another embodiment, the small piston 502 and the large piston 508 are reversed. This orientation would allow for a load with a small travel distance to apply a larger travel to the magnetostrictive element 510. FIG. 4(*b*) depicts another embodiment of the hydraulic force modifier system 500 of FIG. 4(*a*). In the illustrated embodiment, the load is applied to the small piston 502 which pressurizes a storage vessel 514 to store the energy applied by the load. The storage vessel 514 releases the energy through a valve 516 to the large piston 508 to apply force to the element 510. In some embodiments, the energy is released at a specific frequency to increase the efficiency of the power generation. In some embodiments, the pistons 502 and 508 are swapped. In some embodiments, the reservoir 506 is divided (shown by the dashed line through reservoir 506) to isolate the force from/to each piston 502 and 508. Other embodiments may include other arrangements with fewer or more components to achieve less or more functionality. FIG. 5 depicts a schematic diagram of one embodiment of a hydraulic force modifier. The illustrated embodiment depicts a magnetostrictive element 510, a coil 512, and a block-and-tackle system 601. FIG. 6 depicts a schematic diagram of one embodiment of a of a lever partially within an interior of a buoy. The illustrated embodiment depicts a magnetostrictive element 510, a coil 512, and a lever 602.

Other embodiments may incorporate one or more other aspects from related descriptions, including the subject matter described and shown in U.S. application Ser. No. 12/603,138, filed on Oct. 21, 2009, and entitled "Method and Device for Harvesting Energy from Ocean Waves," U.S. application Ser. No. 13/016,828, filed on Jan. 28, 2011, and entitled "Wave Energy Harvester with Improved Performance," U.S. application Ser. No. 13/016,895, filed on Jan. 28, 2011, and entitled "Apparatus for Harvesting Electrical Power from Mechanical Energy," U.S. application Ser. No. 13/361,806 filed on Jan. 30, 2012, and entitled "Energy Harvesting Methods and Devices, and Applications Thereof," U.S. Provisional Application No. 61/664,444, filed on Jun. 26, 2012, and entitled "Magnetostrictive Wave Energy Harvester with Heave Plate," U.S. Provisional Application No. 61/668,280, filed on Jul. 5, 2012, and entitled "Power Generation MWD/LWD Tools and Telemetry," U.S. Provisional Application No. 61/674,982, filed on Jul. 24, 2012, and entitled "Method and Device for Downhole Power Generation," and U.S. Provisional Application No. 61/738,757, filed on Dec. 18, 2012, and entitled "Downhole Energy Harvesting Method and Device each of which is incorporated herein in its entirety.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A device for generating electrical energy from mechanical motion, the device comprising:
   a buoy housing;
   at least one magnetostrictive element disposed within an interior of the buoy housing; and
   at least one force modifier disposed at least partially within the interior of the buoy housing and mechanically coupled to the magnetostrictive element, the force modifier to receive an input force and apply a modified force to the magnetostrictive element, wherein the force modifier comprises a hydraulic system, and wherein the hydraulic system comprises a first hydraulic piston having a first area and a second hydraulic piston having a second area, wherein the first area and the second area are not equal.

2. The device of claim 1, wherein the force modifier comprises a mechanical system.

3. The device of claim 2, wherein the mechanical system comprises a lever.

4. The device of claim 2, wherein the mechanical system comprises a pulley.

5. The device of claim 2, wherein the mechanical system comprises a block-and-tackle system.

6. The device of claim 1, wherein the modified force applied to the magnetostrictive element is greater in magnitude than the input force.

7. The device of claim 1, wherein the modified force applied to the magnetostrictive element comprises a compressive force and the input force comprises a tensile force.

8. A method for generating electrical energy from mechanical motion, the method comprising:
   receiving an input force from a mechanical motion;
   modifying the input force, wherein modifying the input force further comprises operating a hydraulic system, and wherein the hydraulic system comprises a first hydraulic piston having a first area and a second hydraulic piston having a second area, wherein the first area and the second area are not equal; and
   applying a modified output force to a magnetostrictive element disposed within an interior of a buoy housing.

9. The method of claim 8, wherein modifying the input force further comprises operating a mechanical system.

10. The method of claim 9, wherein the mechanical system comprises at least one of a list of systems, the list comprising:
    a lever;
    a pulley; and
    a block-and-tackle.

11. The method of claim 8, wherein modifying the input force comprises transforming a tensile input force to a compressive output force.

12. A buoy apparatus for generating electrical energy from motion of ocean waves, the device comprising:
    a buoy housing;
    a magnetostrictive element disposed within an interior of the buoy housing;
    a tether coupling point;
    a force modifier disposed at least partially within the interior of the buoy housing and coupled to the tether coupling point, the force modifier to receive an input force from the tether coupling point and apply a modified output force to the magnetostrictive element, wherein the force modifier comprises a hydraulic system, and wherein the hydraulic system comprises a first hydraulic piston having a first area and a second hydraulic piston having a second area, wherein the first area and the second area are not equal; and
    a coil disposed within a magnetic field of the magnetostrictive element.

13. The apparatus of claim 12, wherein the force modifier is configured to apply a compressive force to at least one magnetostrictive element while the input force is tensile in nature.

* * * * *